United States Patent
Hsu

(10) Patent No.: US 9,863,784 B2
(45) Date of Patent: Jan. 9, 2018

(54) ORIENTATION ESTIMATION UTILIZING A PLURALITY OF ADAPTIVE FILTERS

(71) Applicant: George Hsu, Boca Raton, FL (US)

(72) Inventor: George Hsu, Boca Raton, FL (US)

(73) Assignee: PNI Sensor Corporation, Santa Rosa, CA (US)

( * ) Notice: Subject to any disclaimer, the term of this patent is extended or adjusted under 35 U.S.C. 154(b) by 367 days.

(21) Appl. No.: 14/619,324

(22) Filed: Feb. 11, 2015

(65) Prior Publication Data

US 2015/0241245 A1    Aug. 27, 2015

Related U.S. Application Data

(60) Provisional application No. 61/943,411, filed on Feb. 23, 2014.

(51) Int. Cl.
| | |
|---|---|
| *G01C 25/00* | (2006.01) |
| *G01C 19/5776* | (2012.01) |
| *G01C 21/16* | (2006.01) |
| *G01R 33/02* | (2006.01) |
| *G01C 23/00* | (2006.01) |

(52) U.S. Cl.
CPC ....... *G01C 25/005* (2013.01); *G01C 19/5776* (2013.01); *G01C 21/16* (2013.01); *G01C 23/00* (2013.01); *G01R 33/02* (2013.01)

(58) Field of Classification Search
None
See application file for complete search history.

(56) References Cited

U.S. PATENT DOCUMENTS

| | | |
|---|---|---|
| 7,451,549 B1 | 11/2008 | Sodhl et al. |
| 7,826,999 B1 | 11/2010 | Boeen et al. |
| 7,844,415 B1 | 11/2010 | Bryant et al. |
| 7,930,148 B1 | 4/2011 | Figaro et al. |
| 8,032,324 B1 | 10/2011 | Bryant et al. |
| 8,749,231 B2 | 6/2014 | Taylor et al. |

(Continued)

OTHER PUBLICATIONS

Feldbauer, Christian, Adaptive Filters—A tutorial for the course computational intelligence, Signal Processing and Speech Comunication Laboratory, Inffeldgasse, downloaded for URL<http://citeseerx.ist.psu.edu/viewdoc/download?doi=10.1.1.220.1456&rep=rep1&type=pdf> on Apr. 4, 2017.*

(Continued)

*Primary Examiner* — Joseph Schoenholtz
(74) *Attorney, Agent, or Firm* — Brian R. Short

(57) ABSTRACT

Apparatuses, methods and systems apparatus for sensing an orientation are disclosed. One apparatus includes an accelerometer, wherein the accelerometer generates a sensed acceleration of the accelerometer and a gyroscope, wherein the gyroscope generates a sensed orientation of the gyroscope. The apparatus further includes a first adaptive filter, the first adaptive filter operative to receive at least the sensed acceleration and the sensed orientation of the gyroscope, and generate a first orientation (Q) of the apparatus, a second adaptive filter, the second adaptive filter operative to receive at least the sensed acceleration and the sensed orientation of the gyroscope, and generate a second orientation (Q') of the apparatus, wherein a tuning for the first adaptive filter is different than a tuning for the second adaptive filter.

14 Claims, 10 Drawing Sheets

(56) References Cited

U.S. PATENT DOCUMENTS

| | | | |
|---|---|---|---|
| 8,957,812 B1* | 2/2015 | Hill | G01S 5/0027 |
| | | | 342/445 |
| 9,223,007 B2* | 12/2015 | Wellman | G01C 21/165 |
| 9,410,809 B2* | 8/2016 | Hogdal | G01C 21/20 |
| 2005/0125141 A1* | 6/2005 | Bye | G01S 19/47 |
| | | | 701/469 |
| 2008/0262772 A1* | 10/2008 | Luinge | G06F 3/011 |
| | | | 702/94 |
| 2011/0015862 A1* | 1/2011 | Sato | E21B 47/022 |
| | | | 702/6 |
| 2012/0158296 A1* | 6/2012 | Waters | G01C 21/16 |
| | | | 701/509 |
| 2013/0009636 A1 | 1/2013 | Figaro et al. | |
| 2013/0110450 A1* | 5/2013 | Kulik | G01C 17/38 |
| | | | 702/141 |
| 2014/0316305 A1 | 10/2014 | Venkatraman et al. | |
| 2016/0077125 A1* | 3/2016 | Buck | G01C 21/16 |
| | | | 73/1.38 |
| 2016/0258778 A1* | 9/2016 | Cochran | G01C 22/006 |

OTHER PUBLICATIONS

Zhang, Shengzhi, Shuai Yu, Chaojun Liu, Xuebing Yuan, and Sheng Liu. "A Dual-Linear Kalman Filter for Real-Time Orientation Determination System Using Low-Cost MEMS Sensors." Sensors 16.2 (2016): 264.*

* cited by examiner

ORIENTATION ESTIMATION UTILIZING A PLURALITY OF ADAPTIVE FILTERS

RELATED APPLICATIONS

This patent application claims priority to U.S. Provisional Patent Application Ser. No. 61/943,411, filed Feb. 23, 2014, which is herein incorporated by reference.

FIELD OF THE EMBODIMENTS

The described embodiments relate generally to adaptive filter structures and specifically to estimating an orientation. More particularly, the described embodiments relate to apparatuses, methods and systems for estimating an orientation utilizing a plurality of adaptive filters.

BACKGROUND

Adaptive filters can be very effectively used to determine attitude and orientation, especially when containing the correct combination of state variables. When such adaptive filters are used to fuse the outputs obtained from a combination of gyroscopes, magnetometers and accelerometers, the gyroscope provides the instantaneous angular displacement, while the magnetometer and accelerometer are used to correct the longer-term errors that accumulate in the gyroscope's output. These errors include bias offset drift, saturation and non-continuous displacements caused by shock. The two main computational threads in such systems are the gyroscope propagation that produces the orientation estimate and the adaptive filter loop that produces the magnetometer and accelerometer-based error correction estimate that the most current gyro propagation result must be corrected by.

Traditional adaptive filters used for the purpose of motion sensor fusion are recursive in structure and provide the most accurate instantaneous snapshot of a device's attitude and orientation in any given moment. The orientation outputs are a single stream of data that are sequentially generated in time. The specific filter's tuning with respect to learning and merging rates as well as other performance parameters can be adjusted to suit the target application. Such applications can vary greatly in the required dynamic behavior of the adaptive filter and can range from high rates of correction for video gaming control, to very low rates of correction for pedestrian dead reckoning.

There are certain applications, however, where due to the complexity of the motion being measured, the performance of the application would benefit greatly from simultaneously having the availability of two or more adaptive filters that are each specifically tuned to optimize the filter's convergence characteristics for different dynamic motions. This plurality of filters and their respective outputs could both be operative on the same set of sensor data, or based upon buffered sensor data that could be advantageously shifted in time. Furthermore, there are many instances where the present sensor data may have a marked improvement in convergence accuracy due to a key set of sensor measurements that happen sometime in the future, so a simultaneous filter structure would allow for the separate computations paths necessary for both instantaneous angular outputs as well as a highly accurate gyro propagation correction once the right set of sensor data are measured.

It is desirable to have apparatuses, methods, and systems for more accurately and efficiently estimating an orientation of a user device.

SUMMARY

An embodiment includes an apparatus. The apparatus includes an accelerometer, wherein the accelerometer generates a sensed acceleration of the accelerometer and a gyroscope, wherein the gyroscope generates a sensed orientation of the gyroscope. The apparatus further includes a first adaptive filter, the first adaptive filter operative to receive at least the sensed acceleration and the sensed orientation of the gyroscope, and generate a first orientation (Q) of the apparatus, a second adaptive filter, the second adaptive filter operative to receive at least the sensed acceleration and the sensed orientation of the gyroscope, and generate a second orientation (Q') of the apparatus, wherein a tuning for the first adaptive filter is different than a tuning for the second adaptive filter.

Another embodiment includes a method for sensing an orientation. The method includes sensing, by an accelerometer, an acceleration of a device, sensing and sensing, by a gyroscope, an orientation of the gyroscope. The method further includes generating, by a first adaptive filter, a first orientation (Q) of the device based on at least the sensed acceleration and the sensed orientation of the gyroscope, generating, by a second adaptive filter, a second orientation (Q') of the device based on at least the sensed acceleration and the sensed orientation of the gyroscope, wherein a tuning for the first adaptive filter is different than a tuning for the second adaptive filter.

Other aspects and advantages of the described embodiments will become apparent from the following detailed description, taken in conjunction with the accompanying drawings, illustrating by way of example the principles of the described embodiments.

DETAILED DESCRIPTION

The described embodiments provide for apparatuses, methods, and systems for sensing an orientation and/or motion. The sensed orientation and/or motion can be of, for example, a computing device or mobile device of a user. An orientation and/or motion of a user of the computing device can be inferred by the orientation and/or motion of computing device. For at least some embodiments, the orientation is sensed utilizing a plurality of adaptive filters. For at least some embodiments, a tuning and/or weighting of the outputs of each of the adaptive filters are different, and for an embodiment, the tuning and/or weighting are adjustable. For an embodiment, the tuning and/or weighting of different adaptive filters is adjusted for providing a corresponding output responsive to a particular type of orientation and/or motion. For an embodiment, the adaptive filters receive inputs from an accelerometer, and a gyroscope. For an embodiment, the adaptive filter further receives an input from a magnetic sensor. Further, at least some embodiments include additional inputs, such as, a received radio frequency (RF) received by the computing device.

Figure 1:
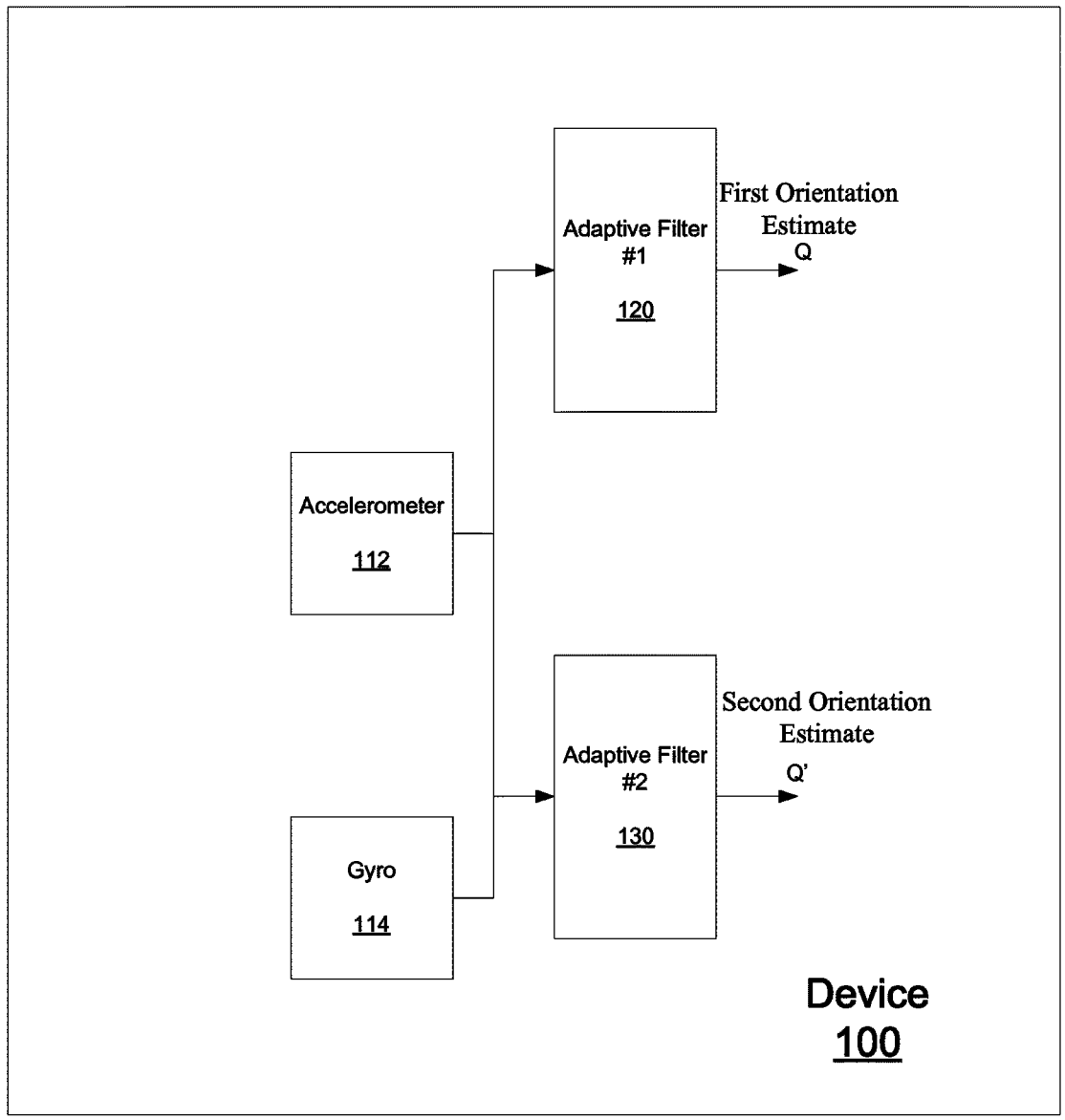
FIG. 1 shows an orientation and/or motion estimation apparatus that includes a plurality of adaptive filters, according to an embodiment.

FIG. 1 shows an orientation estimation apparatus (device 100) that includes a plurality of adaptive filters 120, 130, according to an embodiment. As shown, the apparatus (device 100) includes an accelerometer 112 and a gyroscope 114. The accelerometer 112 senses acceleration of the device 100, and the gyroscope 114 senses an orientation of the gyroscope 114, which provides a representation of the orientation of the device 100. As shown, the first adaptive filter 120 includes a different tuning (Tuning1) than a tuning (Tuning2) of the second adaptive filter 130.

For at least some embodiments, the sensed signal of the accelerometer 112 and the sensed signal of the gyroscope 114 are received by the first adaptive filter 120, and the second adaptive filter 130. Based on the received sensed signals, the first adaptive filter 120 generates a first orientation (Q) of the device, and the second adaptive filter 130 second orientation (Q') of the device. The first adaptive filter 120 and the second adaptive filter 130 each provide a Quaternion. Quaternions, also known as versors, provide a convenient mathematical notation for representing orientations and rotations of objects in three dimensions. While two adaptive filters are shown in FIG. 1, it is to be understood that additional or alternate embodiments can include any number of adaptive filters.

For at least some embodiments, each of the adaptive filters 120, 130 is tuned to allow for identification of a specific or particular type of orientation and/or motion. For example, one of the adaptive filters could be tuned for allowing identification of slower types of motion, whereas another of the adaptive filters could be tuned for faster (for example, higher frequency or transient) types of motion. Each of the orientation estimates provided by the plurality of adaptive filters, can be received by an orientation and/or motion analysis engine that identifies and/or characterizes the orientations.

The tuning of the different adaptive filters includes at least one of frequency tuning, amplitude tuning, and phase tuning. For the example of when device orientation is used as an input for a motion-based video gaming controller, the convergence and merging rates of the adaptive filter work best when set to be high. This is because in game play, rapid and fairly vigorous motion and changes in direction of the device is common, which causes discontinuities in the gyroscope propagation measurements due to shock. These errors due to discontinuities can become noticeable during game play if they are not quickly corrected for. Furthermore, because game play is usually directed towards a spatially fixed display, the arc subtended by the controller is only that of a small portion of the possible sphere. This localization in orientation use makes such a system far less susceptible to errors generated by magnetic field distortions in the space immediately around the controller, so a more rapid merging does not lead to angular tracking degradation.

On the other hand, a navigation oriented application, such as autonomous vehicle guidance control or pedestrian dead reckoning benefit much more from slow merging because their dynamic motions tend to be smoother and do not cause shock induced gyroscope propagation errors. Also, the absolute accuracy of their direction of travel with respect to North needs to be maintained throughout the changing magnetic field conditions that the device may experience as the vehicle or person navigate through and around various structures such as buildings and bridges.

For an embodiment, a motion model of at least one of the adaptive filters is selected to be different than a motion model for another of the adaptive filters, which results in the tuning of the one of the adaptive filters to being different than the tuning of the other of the adaptive filters. For an embodiment, the selection of the motion models includes the selection of coefficients of matrices of the adaptive filters. That is, the filtering operations of each of the adaptive filters can be characterized by coefficients of the adaptive filters, which can be characterized by matrices.

For an embodiment, the motion models provide a first adaptive filter with a different time constant than a second adaptive filter. For an embodiment, the different time constant of the first adaptive filter makes the first adaptive filter more responsive to changes in acceleration than the second adaptive filter. For an embodiment, an output of the second adaptive filter is used for analyzing pedestrian dead reckoning (PDR) of the apparatus, and an output of the first adaptive filter is used for sensing rapid changes in acceleration of the apparatus.

While not shown, for at least some embodiments, each of the outputs of the adaptive filters 120, 130 are received by post processing engines.

Figure 2:
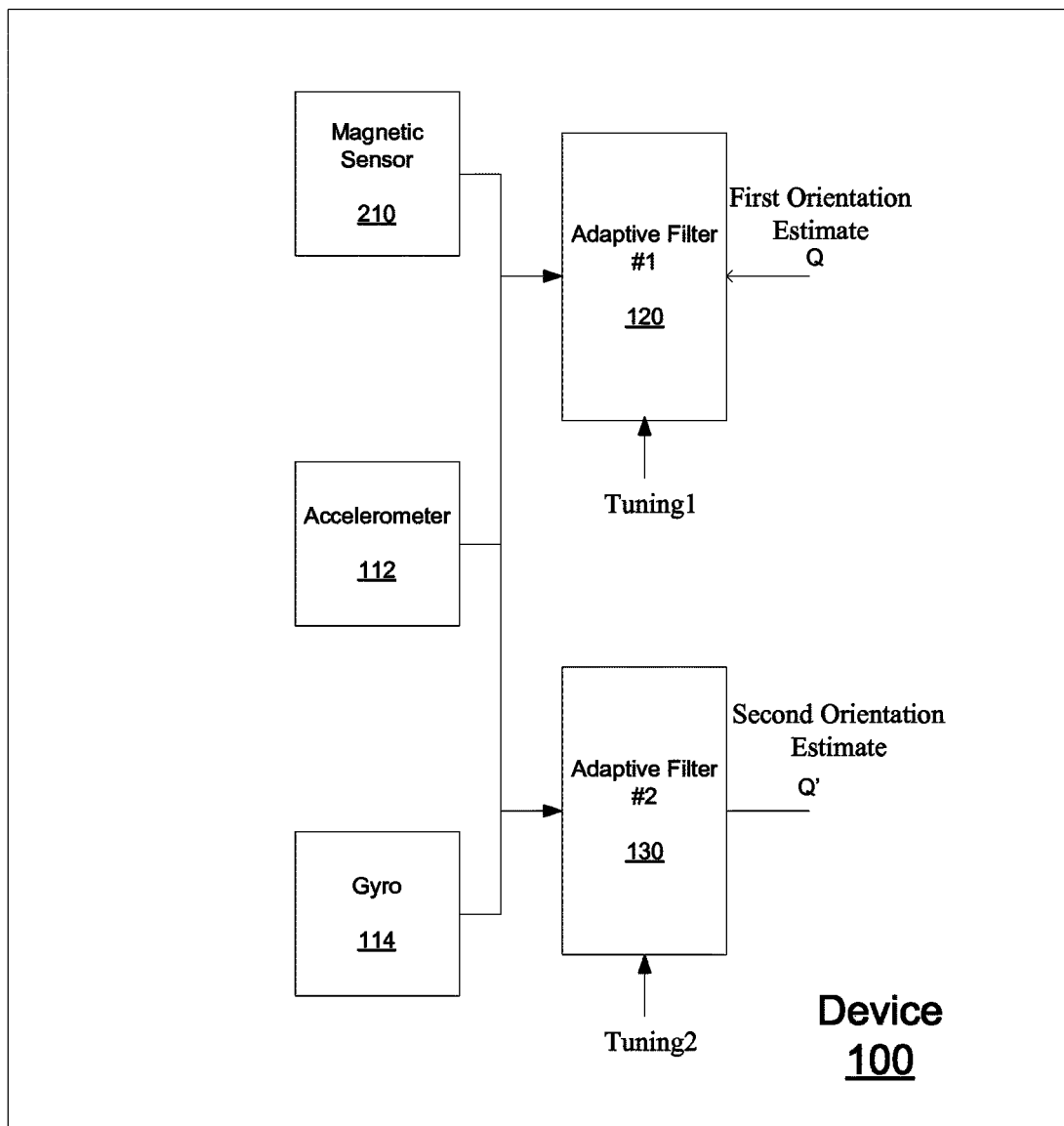
FIG. 2 shows an orientation and/or motion estimation apparatus that includes a plurality of adaptive filters, according to another embodiment.

FIG. 2 shows an orientation and/or motion estimation apparatus that includes a plurality of adaptive filters, according to another embodiment. This embodiment further includes a magnetic sensor 210, wherein the magnetic sensor generates a sensed magnetic field ambient to the magnetic sensor. Further, the first adaptive filter 120 is further operative to receive the sensed magnetic field and generate the first orientation (Q), and the second adaptive filter 130 is further operative to receive the sensed magnetic field, and generate the second orientation (Q').

Traditionally, the magnetic sensor 210 provides the direct measurements of the Earth's magnetic field to construct a second vector in three-dimensional space that combines with the gravitational vector (sensed, for example, by the accelerometer 112) to form the basis of that three dimensional space. This basis can be used to define the rotational coordinates of a device's rotational position within its basis space. However, the use of the magnetic field vector in many adaptive filter implementations is to provide the Earth-frame yaw, azimuth or heading reference for correcting its gyroscope propagated counterpart after an adaptive filter is applied. The accelerometer 112 is used for the same purpose, but for the pitch and roll components of rotation instead.

Figure 3:
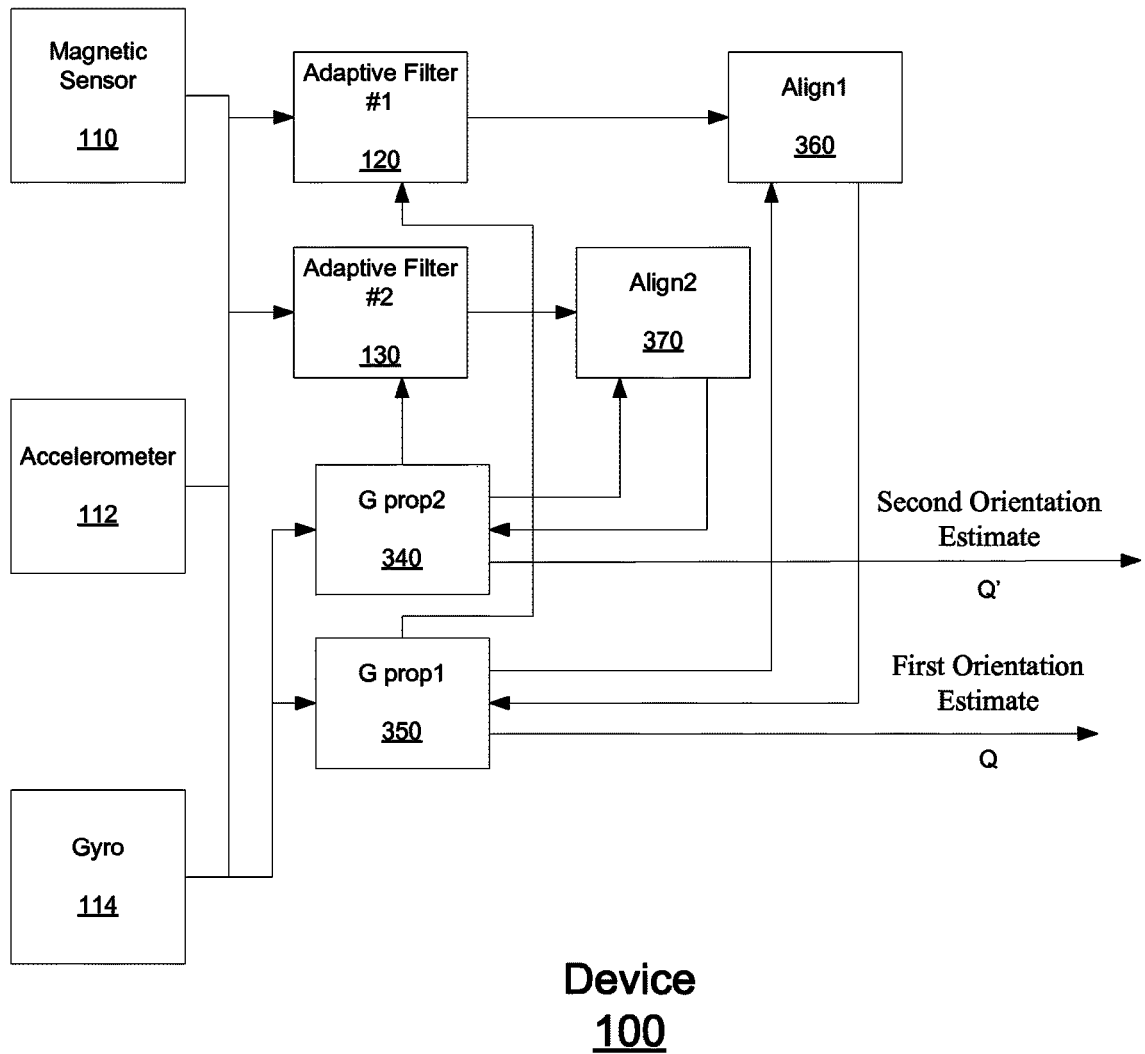
FIG. 3 shows an orientation and/or motion estimation apparatus that includes a plurality of adaptive filters, according to another embodiment.

FIG. 3 shows an orientation and/or motion estimation apparatus that includes a plurality of adaptive filters, according to another embodiment. This embodiment further includes gyroscope props 340, 350, and alignment blocks Align1 360, Align 2 370. The alignment blocks 360, 370 each receive the outputs from the adaptive filters 120, 130, and generate alignment outputs for each of the gyroscope props 340, 350. The gyroscope propagation devices 340, 350 each generate an output for each of the adaptive filters 120, 130.

The gyroscope propagation device (propagation devices 340, 350) maintains the attitude and orientation as calculated solely based upon the gyroscope 114 outputs. For direct angular output gyroscopes this propagated value is determined by a reading of an angular encoder or the addition and subtraction of angular displacements calculated from an initial zero position. For angular rate sensor based gyroscopes, such as MEMS gyroscopes, the propagated angular displacement is calculated by an integration of the angular rate sensor output. In addition to the intrinsically higher noise characteristics possessed by MEMS gyroscopes, the integration step adds additional errors caused by the unknown constant of integration, as well as the Brownian random walk of the gyroscope offset due to the integration of spectral noise. The adaptive filter update loop (in FIG. 3, the adaptive filter update loop includes, for example, adaptive filter 120, alignment block 360, and propagation device 350, and/or adaptive filter 130, alignment block 370, and propagation device 340) takes as inputs the measured magnetic sensor (of the magnetic sensor 110), sensed acceleration (of the accelerometer 112), the gyroscope propagation value and the system's output quaternion value and calculates an error quaternion (such as, QE1 and QE2 outputs of the adaptive filters 120, 130) based upon the specific weighting of the state variable dependent coefficients within the adaptive filters 120, 130. The error quaternion represents the filter's best estimate of the variance between the current gyroscope propagated value and the true angular rotations with respect to a known reference frame, such as the Earth's or device's reference frames. Once the error quaternions are calculated, the alignment blocks 360, 370 simply multiply the current gyro propagated value output by 340 and 350 by the error quaternions Qe1 and Qe2 to produce the system's new output quaternions Q, Q'. These output quaternions, Q and Q' are the values that best represent the true rotational position of the device in three dimensional space, and as previously stated, are also fed back into the adaptive filter update loops as one of the inputs for the calculation of the next error quaternions, Qe2 and Qe1. For at least some embodiments, the structures of adaptive filters 120, 130 are recursive and current outputs are based upon results calculated from the outputs of prior measurement steps.

For an embodiment, the adaptive filters 120, 130 are implemented using Kalman filters.

Kalman Filters

For an embodiment, the Kalman filters, includes a series of measurements observed over time, containing noise (random variations) and other inaccuracies, and produces estimates of unknown variables that tend to be more precise than those based on a single measurement alone. More formally, a Kalman filter operates recursively on streams of noisy input data to produce a statistically optimal estimate of the underlying system state. The Kalman filter has numerous applications in technology. A common application is for guidance, navigation and control of vehicles, particularly aircraft and spacecraft.

For an embodiment, the Kalman filter produces estimates of the current state variables, along with their uncertainties. Once the outcome of the next measurement (necessarily corrupted with some amount of error, including random noise) is observed, these estimates are updated using a weighted average, with more weight being given to estimates with higher certainty. Because of the Kalman filter's recursive nature, it can run in real time using only the present input measurements and the previously calculated state and its uncertainty matrix, while no additional past information is required.

Figure 4:
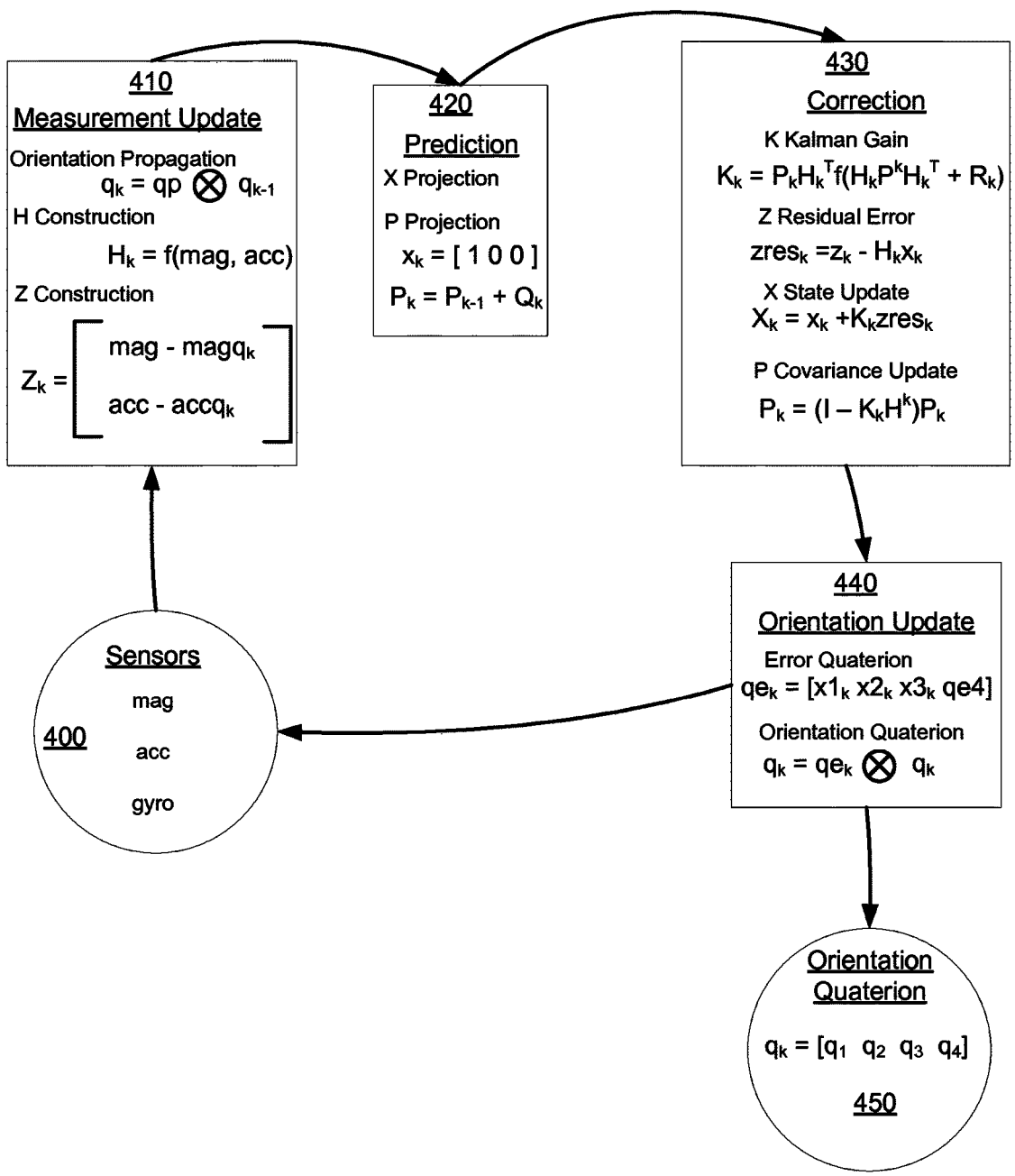
FIG. 4 is a flow chart that includes operational steps of an orientation and/or motion estimation apparatus, according to an embodiment.

FIG. 4 is a functional flow chart that includes operational steps of an adaptive filter and an alignment block, according to an embodiment. The flow chart of the embodiment of the adaptive filter shown in FIG. 4 Blocks 400, 410, 420, 430, 440 and 450 uses the current quaternion update 450 to output to a host system, but also uses it to recursively, along with the next set of sensor measurements of 400, to produce a measurement and process update via the H and Z matrices, as well as well as the 420 Prediction block's Projection matrices Xt and P to further refine the probability models contained in block 430 via the four matrices Kk, Z_RESt, Xt, and Pk. The filter loop then produces error estimate of the current step via the Orientation Update block 440 to produce the next quaternion output to continue the cycle over again. Such a Kalman adaptive filter measures and predicts the probabilistic errors inherent in the measurements, weights the Kalman filter gains to output the best predicted truth, and refines the prediction model for the next measurement and update and output cycle and repeats this process recursively.

Figure 5:
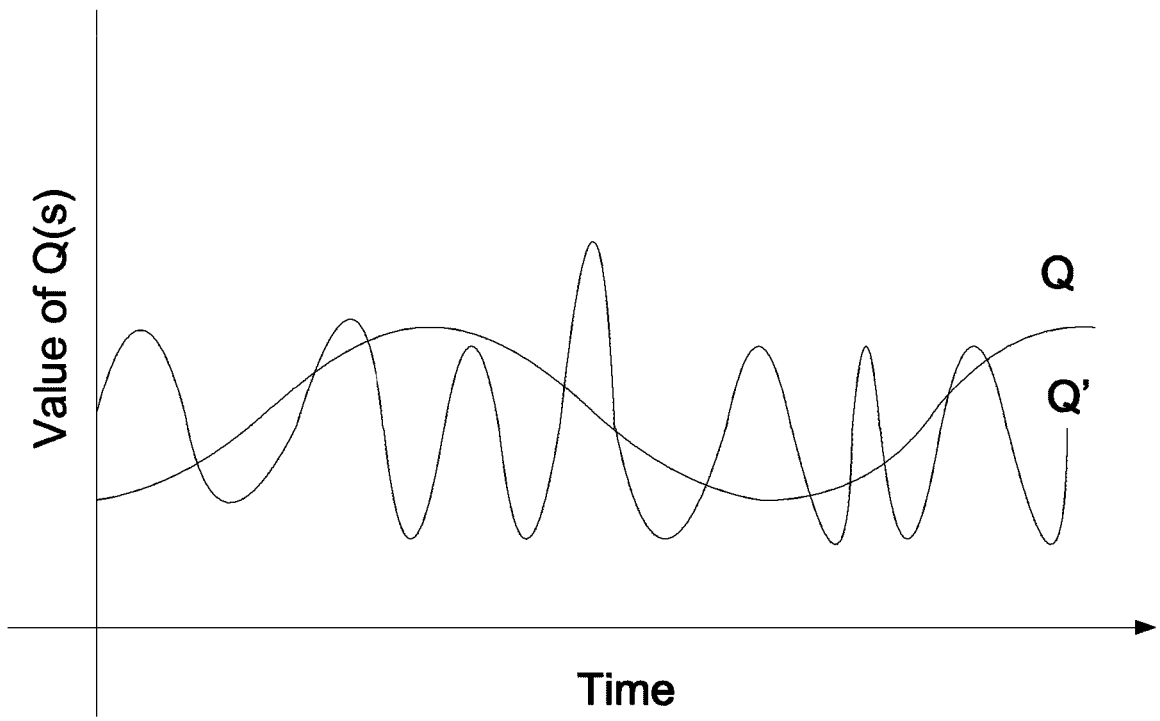
FIG. 5 shows a plot of outputs of a plurality of adaptive filters, wherein a tuning of one adaptive filter is different than a tuning of another adaptive filter.

FIG. 5 shows a plot of outputs (Q and Q') of a plurality of adaptive filters, wherein a tuning of one adaptive filter is different than a tuning of another adaptive filter. As shown, the Q' output include higher frequency components than the Q output, thereby suggesting that the second adaptive filter is tuned to detect/sense higher frequency components of orientation/motion than the first adaptive filter. This can be the case, for example, when the Q output of the first adaptive filter is tuning for determination of PDR of the user of the computing device, and the Q' output of the second adaptive filter is tuning for determination of a first step of the user of the computing device. That is, the PDR determination may be dependent on slow steady state motion of walking of the user, whereas the first step determination may be dependent on short, sudden, transient motion of the users.

The tracking of the motion of a person's center of gravity shows fairly smooth accelerations during the measurement period. A first step event only happens when a person accelerates from zero velocity to the velocity of walking and then this acceleration effectively goes to zero once the person is moving at a constant velocity. This means that the first step event happens very quickly so the filter needs to be set to detect such a quick event, whereas the motion of a person's center of gravity once it reaches constant velocity shows very little additional forward and backwards accelerations, so its timescales are better set to be much longer in duration for the most accurate measurements.

Figure 6:
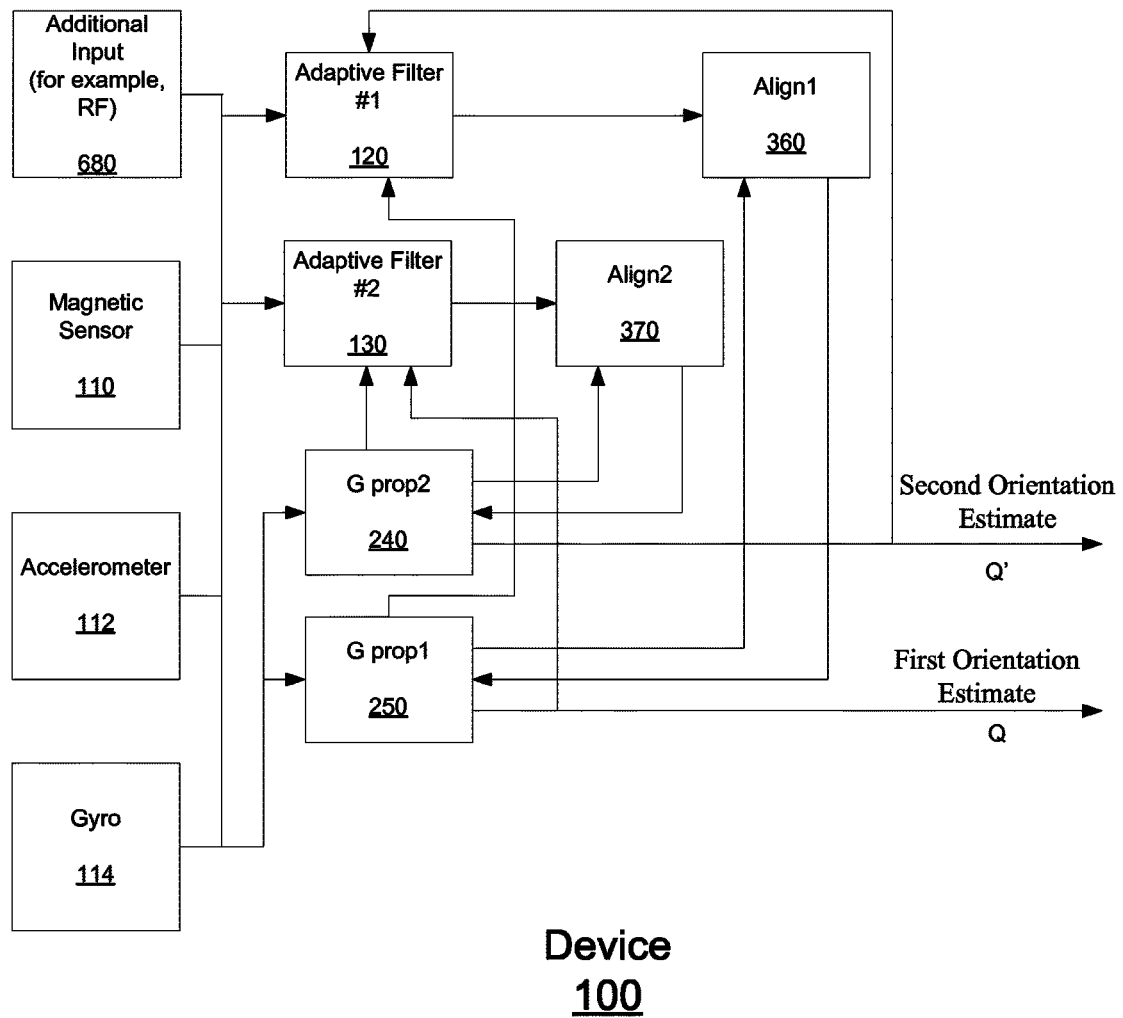
FIG. 6 shows an orientation and/or motion estimation apparatus that includes an additional input to the plurality of adaptive filters, according to another embodiment.

FIG. 6 shows an orientation and/or motion estimation apparatus that includes an additional input (680) to the plurality of adaptive filters, according to another embodiment. For an embodiment, the additional input 680 includes a radio frequency (RF) signal. Accordingly, for an embodiment, at least one of the first adaptive filter 120 and the second adaptive filter 130 is further operative to receive the RF signal received by the apparatus.

Exemplary RF signals include, but are not limited to, cellular wireless signals, WiFi wireless signals, and/or Bluetooth signals. Each of this exemplary RF signals can be used to additionally characterize orientation/motion of the user and computing device of the user. For an embodiment, the adaptive filters are additionally or alternatively tuned based on characteristics of the RF signal being received.

The elements of RF signals that can be adaptively weighted are the Received Signal Strength Indicator (RSSI), Time of Flight (ToF) of the incoming signal, and the direction of the incoming signal if the orientation of the device relative to Earth frame is known.

It is to be understood that while an additional RF input is shown and described, it is to be understood that other additional inputs can be included as well. For example, for a pressure sensor can be utilized for elevation determination of the computing device. For example, proximity sensors can be utilized for determining distances to extremely nearby objects.

Figure 7:
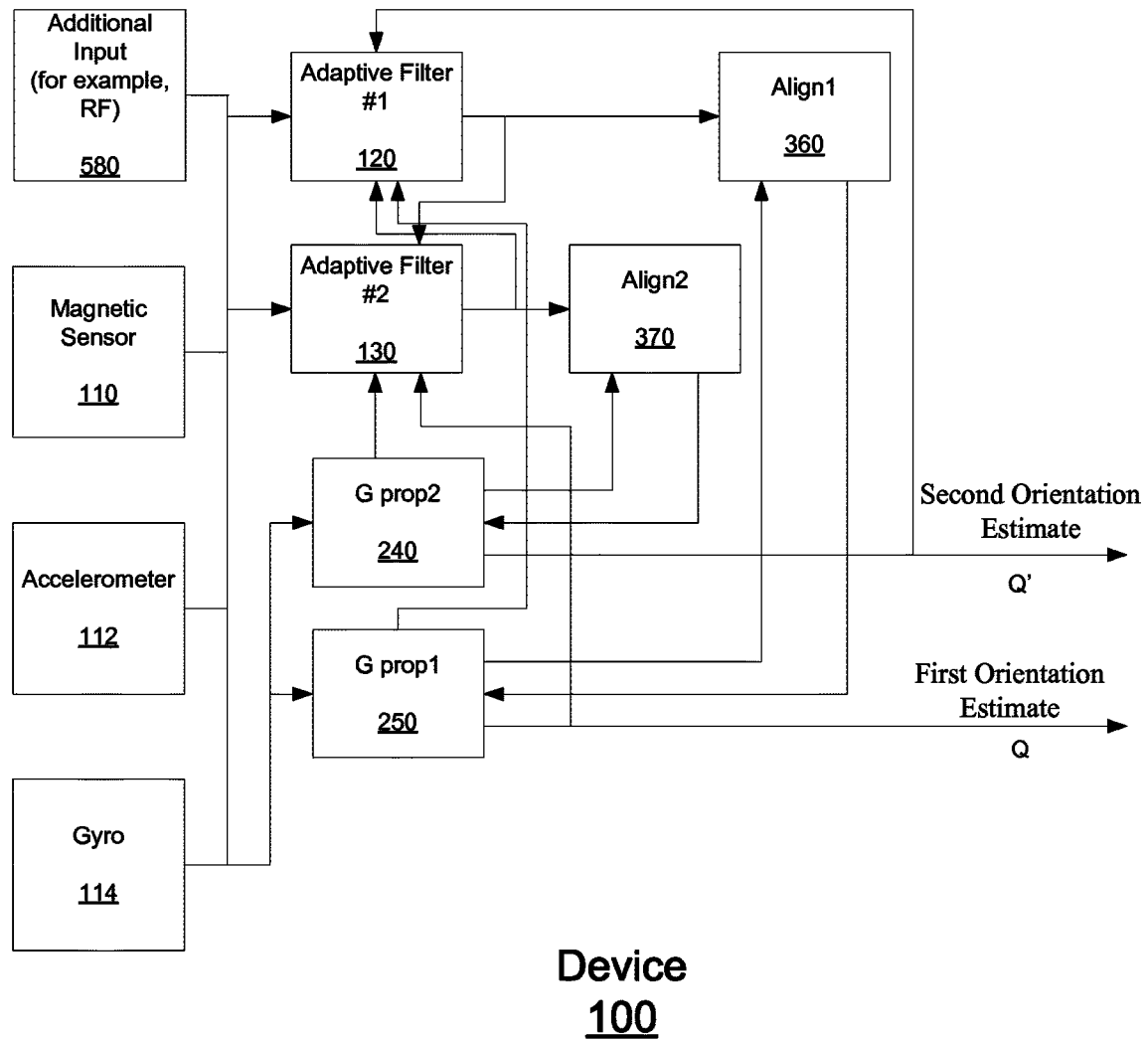
FIG. 7 shows an orientation and/or motion estimation apparatus that includes a plurality of adaptive filters, according to another embodiment.

FIG. 7 shows an orientation and/or motion estimation apparatus that includes a plurality of adaptive filters, according to another embodiment. For this embodiment, the second adaptive filter 130 is additionally operative to receive the first orientation (Q) of the first adaptive filter 120. Further, for this embodiment, the first adaptive filter 120 is additionally operative to receive the second orientation (Q) of the second adaptive filter 130.

For an embodiment, the feedback(s) are time shifted with respect a present Q output. Undesired signals, for example, can be rejected by utilizing the time shifted signal. Further, a selection of which of the outputs of the adaptive filters to be used can be made. Further, for an embodiment, the outputs of the adaptive filters Q and Q' can be themselves weighted to provide a Q" with additional logic determining the blending between of Q and Q' such that Q" is more accurate than either Q or Q' at any moment in time. For an embodiment, blending includes of taking as an output for Q" either Q or Q' at any moment in time, or a weighted sum of the two in real time. For an embodiment, the blending may also be a construction of the time shifted outputs of Q and Q' with respect to each other as well as Q". It should also be understood that Q" may also be recursively generated.

Figure 8:
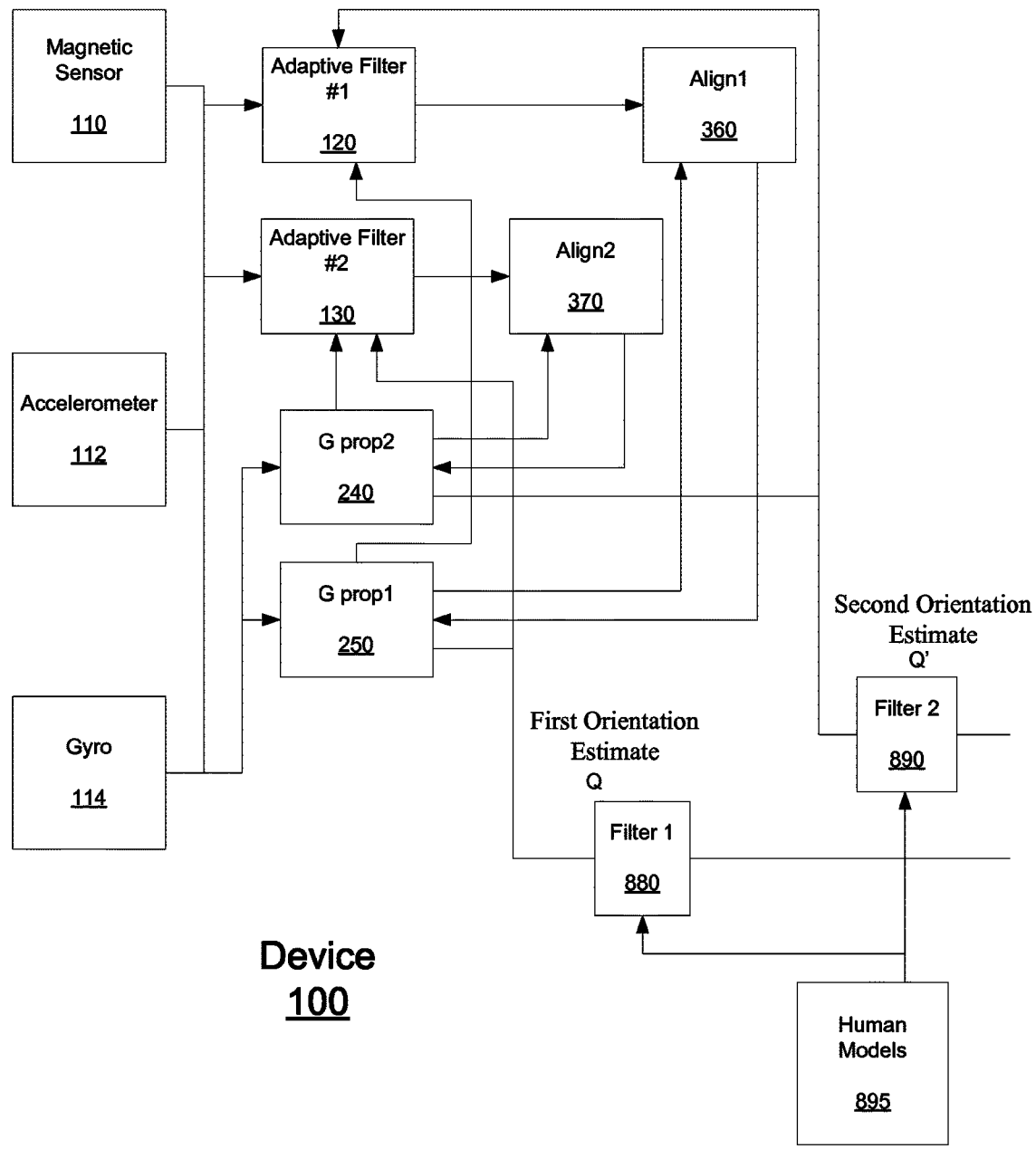
FIG. 8 shows an orientation and/or motion estimation apparatus that includes a plurality of adaptive filters, and human motion models, according to another embodiment.

FIG. 8 shows an orientation and/or motion estimation apparatus that includes a plurality of adaptive filters, and human motion models, according to another embodiment. For an embodiment, the human models are incorporated into the adaptive filters, for example, through external filtering (filters 880, 890) at the outputs of the adaptive filters 120, 130. While depicted in FIG. 8 as being external to the adaptive filters, clearly, the functionality of the filters 880, 890 can be incorporated into the adaptive filters 120, 130. The point is that human models can be accessed from, for example, a database 895, and the human models effectively tune the corresponding adaptive filter to pass (not filter) motion characteristics that are related to a particular human motion.

For at least some embodiments, the human motion models include device acceleration profiles when the computing device is located at particular points on the human body. The main ones include, for example, the computing device in pocket, device in hand in front, device in hand at side and device next to head on the ear. While walking there are very different acceleration characteristics at each of these locations. The idea is to quantify these acceleration characteristics to identify in which position on the body amongst these main categories the device is, and then to modulate the accelerations measured at that location to remove the components of acceleration due to the devices specific location, so that the remaining acceleration is linear acceleration of the person's center of gravity, which, when compared to the magnitudes of these location based accelerations, tend to be many times smaller in signal strength.

Figure 9:
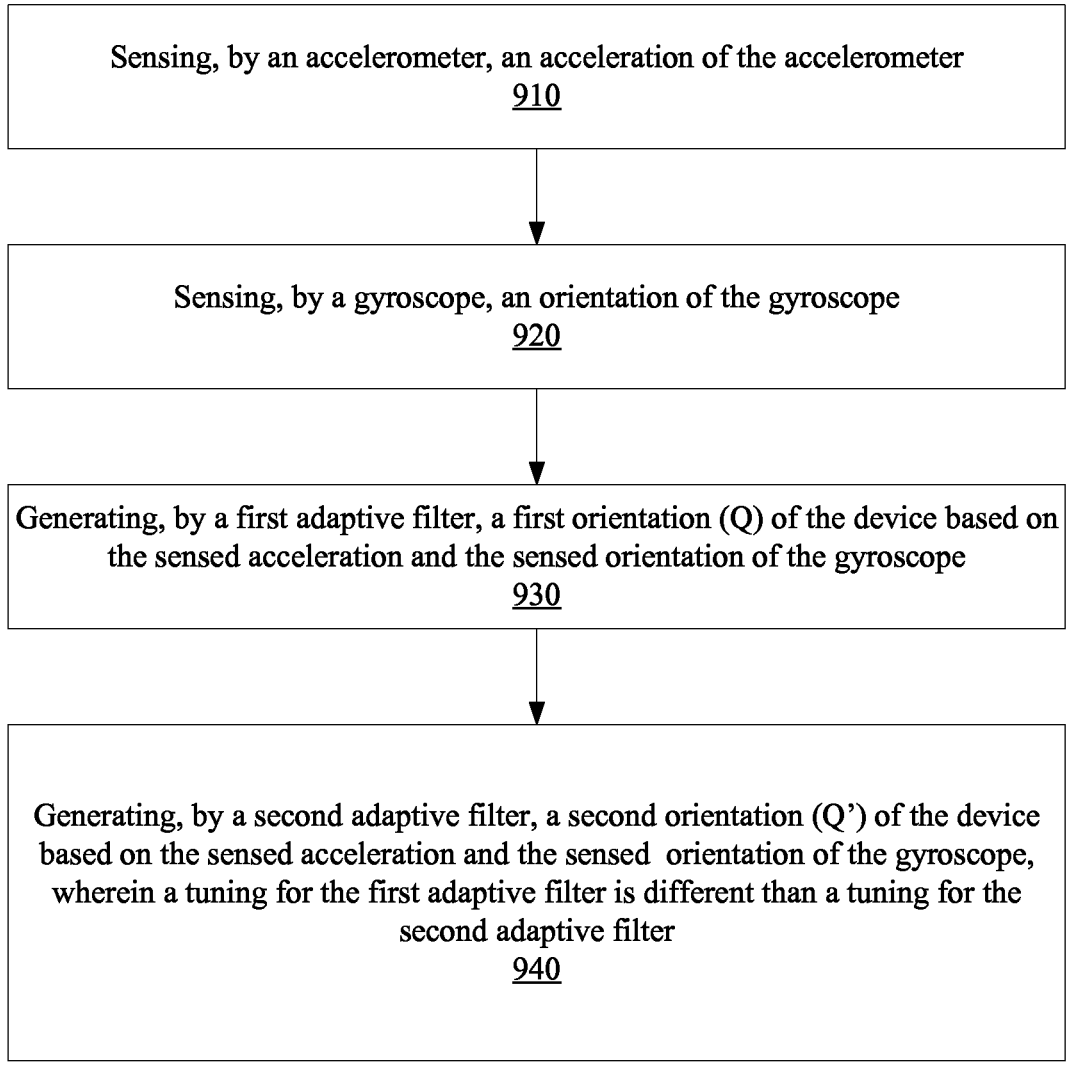
FIG. 9 shows is a flow chart that includes steps of a sensing orientation utilizing dual adaptive filters, according to an embodiment.

FIG. 9 shows is a flow chart that includes steps of a sensing orientation utilizing dual adaptive filters, according to an embodiment. A first step 910 includes sensing, by an accelerometer, an acceleration of the accelerometer. A second step 920 includes sensing, by a gyroscope, an orientation of the gyroscope. A third step 930 includes generating, by a first adaptive filter, a first orientation (Q) of the device based on the sensed acceleration and the sensed orientation of the gyroscope. A fourth step 940 includes generating, by a second adaptive filter, a second orientation (Q') of the device based on the sensed acceleration and the sensed orientation of the gyroscope, wherein a tuning for the first adaptive filter is different than a tuning for the second adaptive filter.

For at least some embodiments, the tuning includes at least one of frequency tuning, amplitude tuning or phase tuning of the adaptive filters. For at least some embodiments, the tuning includes weighting the inputs of the specific sensors to determine "truths".

At least some embodiments further include sensing, by a magnetic sensor, a magnetic field ambient to the magnetic sensor, further generating the first orientation (Q) by the first adaptive filter based on the sensed magnetic field, and further generating the second orientation (Q') by the second adaptive filter based on the sensed magnetic field.

For at least some embodiments, a motion model for the first adaptive filter is selected to be different than a motion model for the second adaptive filter, which results in the tuning of the first adaptive filter being different than the tuning of the second adaptive filter. For an embodiment, noise models for the sensors are pre-characterized relative to the signals being sensed are used to build probability models that are used to weight the adaptive filter coefficients.

For at least some embodiments, the selection of the motion models includes the selection of coefficients of matrices of the adaptive filters. For at least some embodiments, the motion models provide the first adaptive filter with a different time constant than the second adaptive filter. That is, for example, the motion models can be used for control to cause one filter to adapt to one sensor differently (for example, faster) than for another sensor. For an embodiment, the different time constant of the first adaptive filter makes the first adaptive filter more responsive to changes in acceleration than the second adaptive filter. For a specific embodiment, an output of the second adaptive filter is used for analyzing pedestrian dead reckoning (PDR) of the apparatus, and an output of the first adaptive filter is used for sensing rapid changes in acceleration of the apparatus.

For at least some embodiments, coefficients or gains of the sensor inputs are adaptively adjusted.

For at least some embodiments, a first time constant of the generation of the first orientation of the apparatus is different than a second time constant of the generation of the second orientation.

At least some embodiments further include receiving by the second adaptive filter the first orientation (Q) of the first adaptive filter, and at least some embodiments further include receiving by the first adaptive filter the second orientation (Q) of the second adaptive filter.

At least some embodiments further include receiving by at least one of the first adaptive filter and the second adaptive filter a radio frequency (RF) signal received by the apparatus.

At least some embodiments further include comprising filtering at least one of the first orientation, or the second orientation based on human models to determine long and short time constant linear acceleration and gravity separation for pedestrian dead reckoning acceleration measurements.

Figure 10:
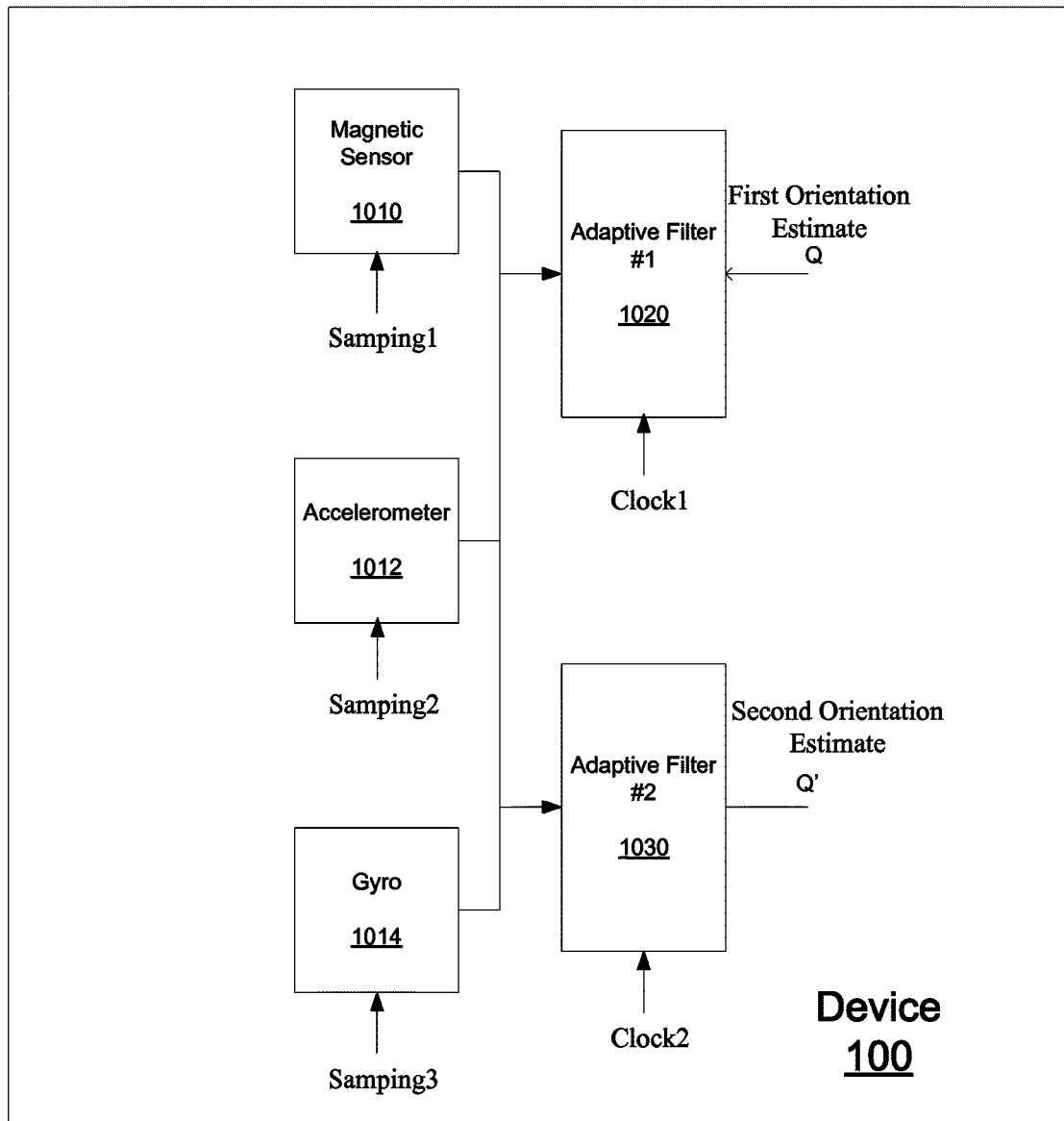
FIG. 10 shows an orientation and/or motion estimation apparatus that includes a plurality of adaptive filters, wherein a clock frequency of at least one of the adaptive

FIG. 10 shows an orientation and/or motion estimation apparatus that includes a plurality of adaptive filters, wherein a clock frequency of at least one of the adaptive filters is different than a sampling frequency of at least one of the sensors, according to another embodiment. The apparatus of FIG. 10 is similar to the apparatus of FIG. 2. However, the sensors 1010, 1012, 1013 have sampling frequency(s) are rates that are different than clock rate(s) of the adaptive filters 1020, 1030.

For an embodiment, the clock rates of the adaptive filters 1020, 1030 are the same. For an embodiment, the clock rates of the adaptive filters 1020, 1030 are the different. Selecting the clock rates of the adaptive filters 1020, 1030 can be useful if, for example, each of the adaptive filters 1020, 1030 is being used for sensing a different type of motion. The clock rates are ideally as low as possible while still ensuring a level of performance.

For an embodiment, the sampling rates of the sensors 1010, 1012, 1013 are each the same. However, for other embodiments one of more of the sampling rates of the sensors is different than one or more of the other sensors.

For an embodiment, the clock frequencies of the adaptive filters are selected or adapted to optimize power consumption, and can be different between adaptive filters based on the desired measurement characteristics.

Further, for at least some embodiments, which sensor are activated can be selectively determined. That is, the adaptive filters may be configured to select different sensors as inputs for different purposes. In one embodiment, one adaptive filter may select as inputs a separate subset of sensors than the other to reduce power consumption. For instance, the gyroscope may be sampled intermittently by one adaptive filter, while the other adaptive filter runs Q calculations on magnetometer and accelerometer inputs only. When the magnetometer and accelerometer based adaptive filter determines large inaccuracies due to accelerations or magnetic distortions, the other adaptive filter may then be run at full gyroscope sampled rate. Feedback would be necessary, as in FIG. 6, for the magnetometer and accelerometer adaptive filter derived Q would be necessary to update the gyroscope based Q' on the intermittent wakeups in order for the gyroscope propagation to be reset from the correct angular starting point, and the Q' would be used to determine if there is an error in Q. In other words, a Q" could be determined from Q and Q' for the purposes of power savings.

Although specific embodiments have been described and illustrated, the described embodiments are not to be limited to the specific forms or arrangements of parts so described and illustrated. The embodiments are limited only by the appended claims.

What is claimed:

1. An apparatus, comprising:
   an accelerometer, wherein the accelerometer generates a sensed acceleration of the accelerometer;
   a gyroscope, wherein the gyroscope generates a sensed orientation of the gyroscope;
   a first adaptive filter, wherein the first adaptive filter receives the sensed acceleration and the sensed orientation of the gyroscope, and generates a first orientation (Q) of the apparatus;
   a second adaptive filter, wherein the second adaptive filter receives the sensed acceleration and the sensed orientation of the gyroscope, and generates a second orientation (Q') of the apparatus; wherein
   a tuning for the first adaptive filter is different than a tuning for the second adaptive filter.

2. The apparatus of claim 1, further comprising:
   a magnetic sensor, wherein the magnetic sensor generates a sensed magnetic field ambient to the magnetic sensor; wherein
   the first adaptive filter further operative to receive the sensed magnetic field and generate the first orientation (Q);
   wherein the second adaptive filter further receives the sensed magnetic field, and generates the second orientation (Q').

3. The apparatus of claim 1, wherein a motion model for the first adaptive filter is selected to be different than a motion model for the second adaptive filter, which results in the tuning of the first adaptive filter being different than the tuning of the second adaptive filter.

4. The apparatus of claim 3, wherein the selection of the motion models includes the selection of coefficients of matrices of the adaptive filters.

5. The apparatus of claim 3, wherein the motion models provide the first adaptive filter with a different time constant than the second adaptive filter.

6. The apparatus of claim 5, wherein the different time constant of the first adaptive filter makes the first adaptive filter more responsive to changes in acceleration than the second adaptive filter.

7. The apparatus of claim 6, wherein an output of the second adaptive filter is used for analyzing pedestrian dead reckoning (PDR) of the apparatus, and an output of the first adaptive filter is used for sensing rapid changes in acceleration of the apparatus.

8. The apparatus of claim 1, wherein coefficients or gains of the sensor inputs are adaptively adjusted.

9. The apparatus of claim 1, wherein a first time constant of the generation of the first orientation of the apparatus is different than a second time constant of the generation of the second orientation.

10. The apparatus of claim 1, wherein the second adaptive filter additionally receives the first orientation (Q) of the first adaptive filter.

11. The apparatus of claim 1, wherein the first adaptive filter additionally receives the second orientation (Q) of the second adaptive filter.

12. The apparatus of claim 1, wherein at least one of the first adaptive filter and the second adaptive filter receives a radio frequency (RF) signal received by the apparatus.

13. The apparatus of claim 1, wherein the orientation includes a velocity estimate based on linear acceleration, and a double integration for distance estimates.

14. The apparatus of claim 1, further comprising a first filter receiving and filtering the first orientation, and a second filter receiving and filtering the second orientation, wherein the first filter and the second filter are tuned based on human models to determine long and short time constant linear acceleration and gravity separation for pedestrian dead reckoning acceleration measurements.

* * * * *